US012707587B2

(12) United States Patent
Schonhardt et al.

(10) Patent No.: US 12,707,587 B2
(45) Date of Patent: Aug. 11, 2026

(54) DEVICE FOR RECEIVING A DISPLAY FOR AN AUTOMATION FIELD DEVICE

(71) Applicant: Endress+Hauser SE+Co. KG, Maulburg (DE)

(72) Inventors: Raphael Schonhardt, Rheinfelden (DE); Michael Lais, Schönau im Schwarzwald (DE); Vitogiuseppe Di Cosola, Hartheim (DE); Christian Strittmatter, Rickenbach (DE); Simon Gerwig, Schopfheim (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 54 days.

(21) Appl. No.: 18/687,507

(22) PCT Filed: Jul. 27, 2022

(86) PCT No.: PCT/EP2022/071051
§ 371 (c)(1),
(2) Date: Feb. 29, 2024

(87) PCT Pub. No.: WO2023/030771
PCT Pub. Date: Mar. 9, 2023

(65) Prior Publication Data

US 2024/0357761 A1 Oct. 24, 2024

(30) Foreign Application Priority Data

Aug. 31, 2021 (DE) ..................... 10 2021 122 569.8

(51) Int. Cl.
*H05K 7/14* (2006.01)
*H05K 5/00* (2006.01)

(52) U.S. Cl.
CPC ......... *H05K 7/1481* (2013.01); *H05K 5/0018* (2022.08)

(58) Field of Classification Search
CPC .. H05K 5/0018; H05K 7/1481; H05K 5/0017; H05K 5/0217
USPC ......................................... 361/752, 796, 800
See application file for complete search history.

(56) References Cited

U.S. PATENT DOCUMENTS

2006/0128171 A1* 6/2006 Schmidt ............... H05K 7/1427 439/61

FOREIGN PATENT DOCUMENTS

| | | | | |
|---|---|---|---|---|
| CN | 208333525 U * | 1/2019 | ............. G01D 18/00 |
| DE | 102014114641 A1 | 4/2016 | |
| DE | 102015110350 A1 | 12/2016 | |
| DE | 102019119426 A1 | 1/2021 | |
| EP | 2149763 A2 * | 2/2010 | ........... H05K 5/0017 |

(Continued)

*Primary Examiner* — Hung S. Bui
(74) *Attorney, Agent, or Firm* — Kelly J. Smith; Endress+Hauser (USA) Holding, Inc.

(57) ABSTRACT

A device for receiving a display, and for introduction into a display holder, for a field device of automation technology includes an essentially planar, rectangular, device body having a receiving area formed on a first side of the device body for receiving a display. At least one spring element is arranged on a second side of the device body and formed in such a manner that in a restrained state, in which the device is secured on a support plate, the spring element exerts a spring force on the support plate in such a manner that the device presses the display arranged in the receiving area in the direction of a normal vector of the receiving area.

10 Claims, 4 Drawing Sheets

(56) References Cited

FOREIGN PATENT DOCUMENTS

| | | | | |
|---|---|---|---|---|
| EP | 1790204 B1 | | 12/2016 | |
| EP | 3314701 B1 | | 8/2019 | |
| WO | WO-2016185301 A1 | * | 11/2016 | ............ F24C 15/104 |

* cited by examiner

DEVICE FOR RECEIVING A DISPLAY FOR AN AUTOMATION FIELD DEVICE

CROSS-REFERENCE TO RELATED APPLICATIONS

The present application is related to and claims the priority benefit of DPMA Patent Application No. 10 2021 122 569.8, filed on Aug. 31, 2021, and International Patent Application No. PCT/EP2022/071051, filed Jul. 27, 2022, the entire contents of which are incorporated herein by reference.

TECHNICAL FIELD

The invention relates to a device for receiving a display, and, preferably, for introduction into a display holder, for a field device of automation technology, as well as to a field device of automation technology.

BACKGROUND

Known from the state of the art are field devices used in industrial plants. Field devices are applied often in process automation technology, as well as in manufacturing automation technology. Referred to as field devices are, in principle, all devices, which are applied near to a process and which deliver, or process, process relevant information. Field devices are used for registering and/or influencing process variables. Serving for registering process variables are measuring devices, particularly sensors. Such are used, for example, for pressure- and temperature measurement, conductivity measurement, flow measurement, etc., and register the corresponding process variables, pressure, temperature, conductivity, pH value, fill level, flow, etc. Used for influencing process variables are actuators. Such are, for example, pumps or valves, which can influence the flow of a liquid in a tube or pipe or the fill level in a container. Besides the above mentioned measuring devices and actuators, referred to as field devices are also remote I/Os, radio adapters, and, in general, devices, which are arranged at the field level.

A large number of such field devices are manufactured and sold by the Endress+Hauser group of companies.

In the case of hygienic processes, especially high requirements are present as regards processing and/or cleanliness. Examples of hygienic process are applications in the foods industry, where the danger exists that deposits and/or impurities can degrade storability and/or lead to health harmful contaminations of food.

In order to meet these requirements, the housings of such field devices are specially embodied. For example, they are manufactured of a metal material, such as, for example, 316L stainless steel and/or are so designed that as little as possible sites result, where deposits and/or impurities can get caught.

Furthermore, the field devices for these applications are frequently formed as hermetically encapsulated devices. This has the result that operating- and display elements are usually arranged behind a viewing pane in the inner space of the field device and outwardly hermetically encapsulated by the viewing pane. Such operating- and display elements cannot be just means for display of information, but must, instead, also provide means for interacting with a field device for its servicing and/or operation. Applied for such interaction are, for example, capacitive keys, which can be formed as part of the operating- and display element, for example, in the form of a corresponding film. In the following, such operating- and display elements are also referred to as display.

Disadvantageous in this is that operating of such capacitive keys of the display and/or a good readability is only possible when the display due to the hermetic encapsulation arranged behind the viewing pane lies as planarly as possible and without separation against the viewing pane.

SUMMARY

An object of the invention is to provide means by which such a display can be arranged as planarly as possible and without separation against a viewing pane of a field device of automation technology.

The object is achieved by the device and by the field device of automation technology according to the present disclosure.

The device of the invention for receiving a display, and, preferably, for introduction into a display holder, for a field device of automation technology, comprises:

- an essentially planar, preferably rectangular, device body having a receiving area formed on a first side of the device body for receiving a display;
- at least one spring element arranged on a second side of the device body and formed in such a manner that in a restrained state, in which the device is secured on a support plate, the spring element exerts a spring force on the support plate in such a manner that the device presses the display arranged in the receiving area in the direction of a normal vector of the receiving area.

According to the invention, a device is proposed, which is connectable with a support plate and which by a resilient suspension by means of the spring element provides that the display is pressed against a viewing pane. Furthermore, the device cancels all tolerances resulting in the installed state from tolerances of the individual components.

An advantageous embodiment of the device of the invention provides, furthermore, that there is arranged on the device body on the second side at least one guide pin, by means of which the device is positionable on the support plate.

Another advantageous embodiment of the device of the invention provides that on the second side, furthermore, at least one retainer element is formed, for example, in the form of a catch or retainer hook, by means of which the device is securable on the support plate.

Another advantageous embodiment of the device of the invention provides that a plurality of guide pins and/or a plurality of retainer elements are formed on the second side and, preferably, in each case, two guide pins, and, in each case, two retainer elements are arranged diagonally relative to one another on different edges of the basic body. Especially, the embodiment can provide that the at least one guide pin and the at least one retainer element are arranged, in each case, on the same edge.

Another advantageous embodiment of the device of the invention further includes at least two spring elements, which are arranged in such a manner on the second side that the two spring elements are arranged on opposing edges of the device body.

Another advantageous embodiment of the device of the invention provides that each spring element is formed in such a manner that it is formed as a resilient quarter circle shaped leg, or bar, which is mounted at one end on the basic body and at the other end in the restrained state presses against the support plate.

The invention relates further to a field device of automation technology comprising:

a field device housing, which surrounds an inner space;

a viewing pane integrated in or secured on the field device housing for a display;

a display arranged behind the viewing pane in the inner space of the field device housing;

a device as defined above arranged in the inner space of the field device housing, wherein the display is arranged in the receiving area of the device and the device is arranged and restrained in the inner space in such a manner that the at least one spring element presses the display arranged in the receiving area against a rear side of the viewing pane.

An advantageous embodiment of the automation field device of the invention further includes a support plate, preferably a circuit board, correspondingly arranged in the inner space of the field device housing, wherein the device is secured to the support plate and the support plate is arranged in the inner space in such a manner that the device secured thereto because of the at least one spring element presses the display arranged in the receiving area against the rear side of the viewing pane. Especially, the embodiment can further comprise a display holder, produced preferably of a plastic, wherein the display holder includes retainer elements, by means of which the display holder is secured to the support plate and wherein the display holder receives the display frame with the display arranged in the receiving area, wherein the display holder preferably includes, furthermore, the viewing pane, such that the display holder, the display frame, the support plate and the viewing pane form a unit, which by a corresponding seating in the field device housing is integrated in the field device, preferably during manufacture of the field device.

BRIEF DESCRIPTION OF THE DRAWINGS

The present disclosure will now be explained in greater detail based on the appended drawing, the figures of which show as follows.

DETAILED DESCRIPTION

Figure 1:
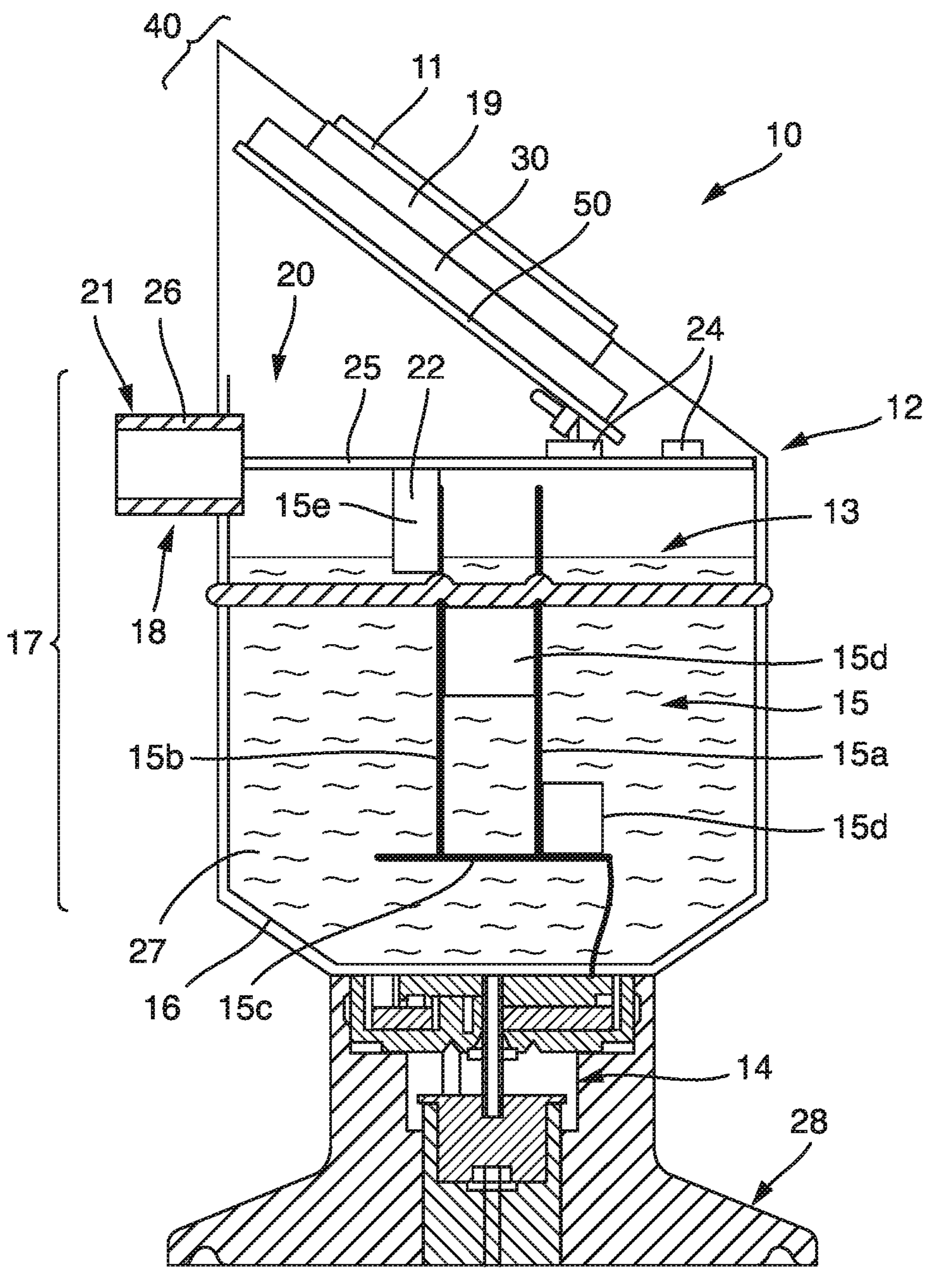
FIG. 1 shows a schematic, sectional view of a field device of automation technology designed for use in hygienic applications and having a display frame of the present disclosure.

FIG. 1 shows a schematic, sectional view of a field device 10 of automation technology. Field device 10 includes a field device housing 12, which surrounds an inner space 13. Field device housing 12 includes an at least sectionally rotationally symmetric region 17, into which the field contact plug 21 is to be integrated, or is integrated. Field device 10 further includes, terminally arranged on the field device housing 12, a sensor module having a sensor- and/or actuator element 14, which serves for setting and/or registering a process variable, and a process connection 28. Process connection 28 can be a threaded structure or a screw- or clampable flange.

Sensor- and/or actuator element 14 comprises in the present example of an embodiment a fill level sensor element for registering a fill level as process variable. The invention is, however, not limited to type, or particular embodiment, of the sensor- and/or actuator element, which can, instead, operate on the basis of any other sensor- or actuator principle.

Serving for providing and/or conditioning a sensor- and/or actuator signal is an electronic circuit 15 located in the inner space 13 of the field device housing and embodied to operate the sensor- and/or actuator element 14.

In the present example of an embodiment, the electronic circuit includes three circuit boards, of which two circuit boards 15*a* and 15*b* are arranged in the longitudinal direction of the housing and a circuit board 15*c* in the transverse direction of the housing. Circuit boards 15*a*, 15*b*, 15*c* are plugged in relative to one another via corresponding plug-in connections 15*d* and, thus, are electrically contacted. The plug-in connections can be formed as rigid or flexible connections. The plug and receptacle of a plug-in connection can be on either side The electronic circuit further comprises an interface electronics 20 having at least a first circuit board 25 with the field contact plug 21, which is arranged and soldered-on along a longitudinal axis of the circuit board 25 at a circuit board edge. Through field contact plug 21, data, especially measured values, and/or energy are transferred from the field device 10 to an external unit, for example, a superordinated unit or other field device.

Field contact plug 21 can especially be a circular connection, for example, an M12 circular connector. It can, however, also be any other established plug connection suitable for transferring data and/or energy. For example, it can also be an Ethernet connection. Furthermore, the field contact plug 21 can also include a cable gland, through which a line for electrical contacting is led into the inner space of the field device.

The interface electronics 20 further comprises at least one receptacle 22, which can be arranged and placed in such a manner on the first circuit board 25 that a plug axis 23 is tilted inclined relative to a main plane in which the first circuit board 25 lies. Via the receptacle 22 of the interface electronics, such is connected with one of the circuit boards of the electronic circuit via a matching plug 15*e* mounted thereon. Plug and receptacle can be formed as rigid or flexible connectors. Likewise, plug- and receptacle can be interchanged. Further mounted on the first circuit board 25 can be electronic components 24 for EMC- and/or explosion protection purposes.

The electronic circuit 15 located in the field device 10 is arranged, at least partially, in an electronics pot 16, which has a sturdy seat in the field device housing and, in given cases, also serves to secure the circuit boards of the electronic circuit. The electronics pot 16 is, in such case, essentially fitted to an outer contour of the field device housing. Furthermore, the electronic circuit parts located in the electronics pot can be potted by means of a potting compound 27.

Field device housing 12 further includes a housing opening 18, through which the field contact plug is led outwardly. For mechanical securement and/or orientation, i.e. positioning, an exactly fitting plug conduit 26 is placed over the field contact plug in, or on, the field device housing. The plug conduit is welded to the exterior of the field device housing. In order to secure the plug conduit during the welding procedure, it can be secured to the electronics pot by means of a securement system. Such can occur, for example, via a retainer mechanism arranged on the electronics pot in the field device housing. For example, a first securement element can be implemented by means of a retainer geometry injection molded onto the electronics pot, e.g. in the form of a catch. In order to enable a retaining, e.g. clipping, the plug conduit is provided with a surrounding groove as a second securement element. By interaction of the two securement elements, it is avoided that the field contact plug can come loose during the welding procedure, for example, as a result of the dynamics of the welding unit or the influence of protective gas flow, since the plug conduit is secured to the 10) electronics pot. Furthermore, a laser beam has free access to the weld site.

On an upper end of the field device 10, the field device housing 12 includes a display 19 for displaying information and/or interacting with the field device. The display can have capacitive keys for the interaction. Such can be implemented, for example, by a corresponding capacitive film. In order to meet hygienic requirements, the display is arranged in the inner space 13 of the field device behind a viewing-, and interaction, pane 11 integrated in the housing 12. In order to have a best possible view, or readability, of information on the display 19 located behind the viewing pane 11 and/or a friction free operation of capacitive keys, it is necessary that the display 19 lies as planarly and/or uniformly as possible against the rear side of the viewing-, and interaction, pane 11. Serving 20) for this in the present example of an embodiment is a display frame 30, which, on the one hand, receives the display and, on the other hand, places it appropriately behind the viewing-, and interaction, pane 11.

Figure 2:
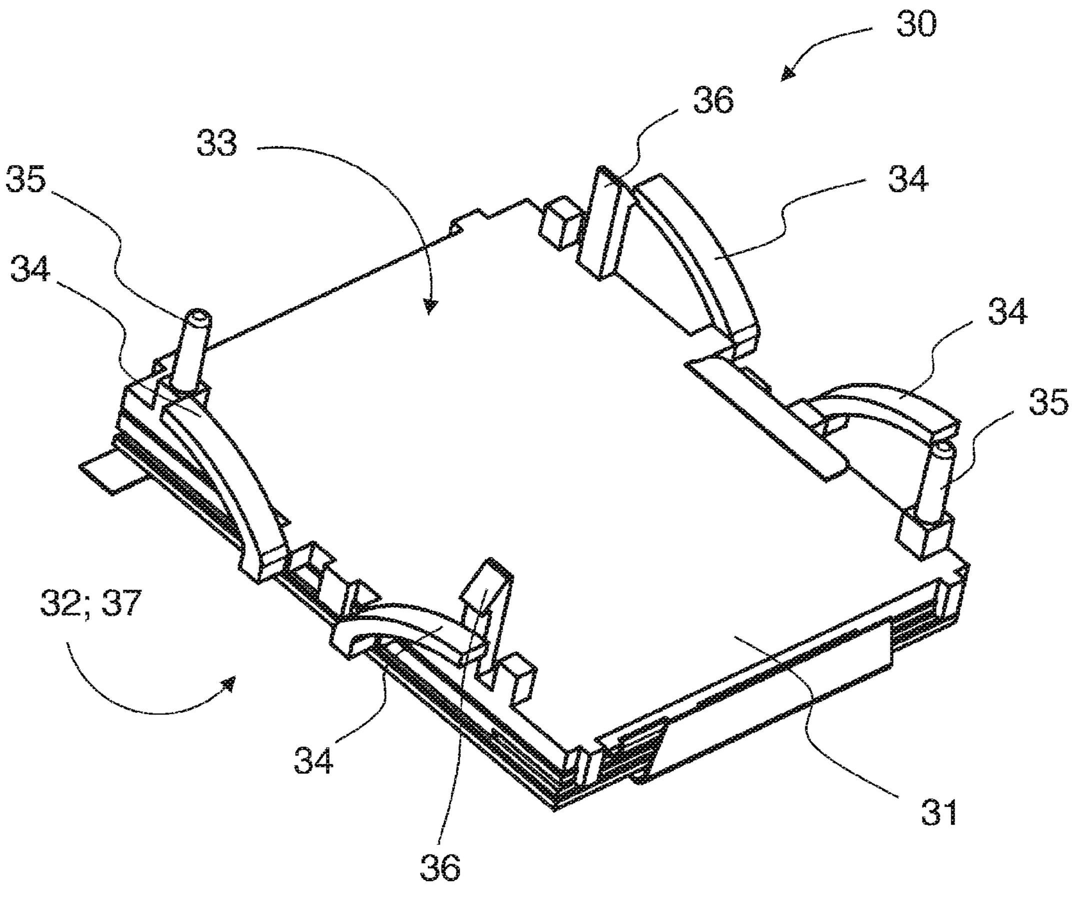
FIG. 2 shows a rear side of an advantageous embodiment of the display frame of the present disclosure.

FIG. 2 shows such a display frame 30 of the invention. Display frame 30 includes an essentially planar, preferably rectangular, basic body having a receiving area formed on a first side (front side) 32 of the device body 31 for receiving a display.

FIG. 2 shows a second side (rear side) 33 of the display frame 30 of the invention. Formed on the rear side 33 can be a plurality of retainer elements 36 in the form of retainer hooks, which serve for releasably securing the display frame 30 on a support plate 50.

Furthermore, the display frame 30 includes a plurality of guide pins 35, which serve to assure an axial orientation of the display 19 arranged in the receiving area relative to the support plate 50, to which the display frame 30 is securable. The guide pins 35 can, in such case, be arranged diagonally relative to one another on the rear side 33 of the basic body 31.

In the example of an embodiment shown in FIG. 2, the display frame 30 includes on the rear side 33 four spring element 34, which serve to press the display 19 located in the receiving area 37 in the restrained state in the direction of a normal vector to the receiving area 60. For this, the spring elements 34 are formed as resilient, quarter circle shaped legs, or bars, which are connected on one end to the basic body 31 and at the other end in the restrained state press on the support plate 50, such that the display is pressed in the direction of the normal vector 60. The display frame can be made of a plastic, especially by an injection molding method.

Figure 3:
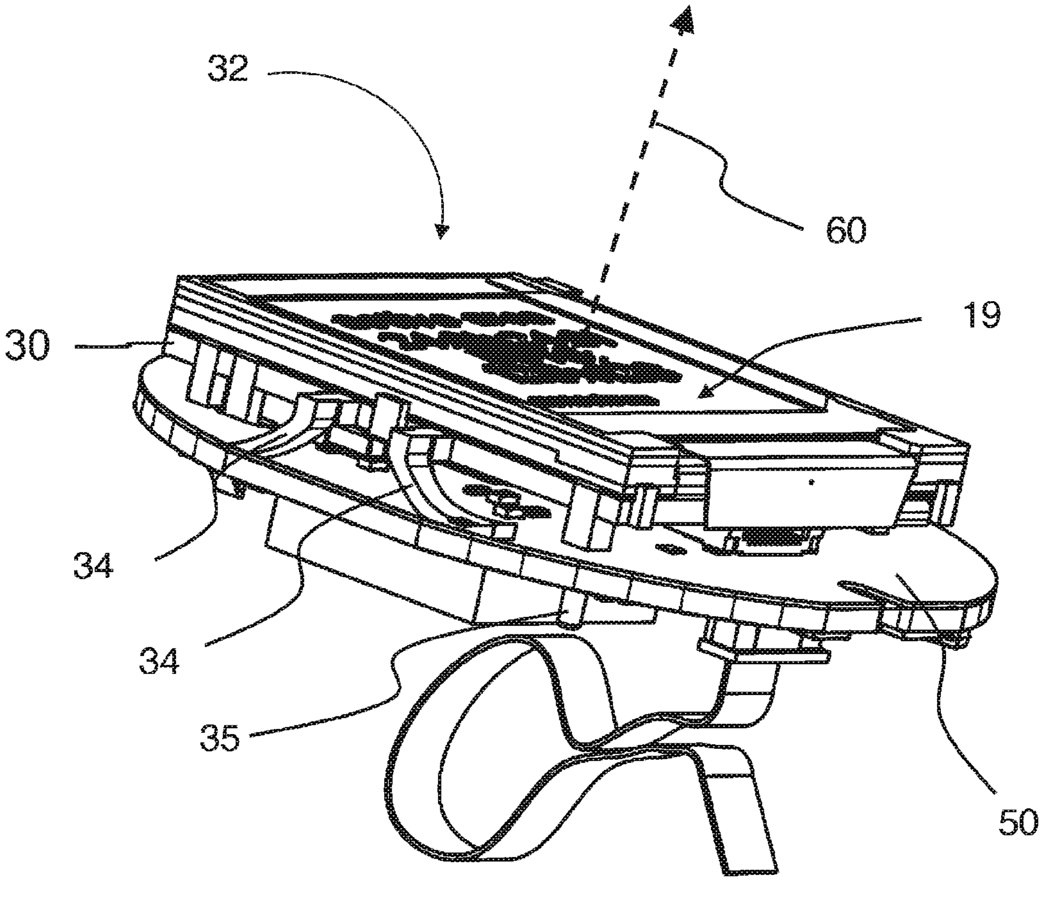
FIG. 3 shows a display frame of the present disclosure in the installed state.

FIG. 3 shows the display frame 30 in the installed state, i.e. the display frame 30 is secured on a support plate 50 appropriately positioned in the inner space 13, such that the display 19 arranged in the receiving area 37 and, in given cases, secured there is pressed by the display frame 30 against the viewing pane 11. The support plate is in the present case a circuit board 50, which can be adapted, for example, to enable the evaluation and/or driving and interaction of the display 19. Display frame 30 is, in such case, axially oriented via the guide pins 35, which are led into corresponding bores on the circuit board 50. The display frame 30 is secured via two retainer hooks 36, which engage a display frame 30 far side of the circuit board 50 for securement.

Figure 4:
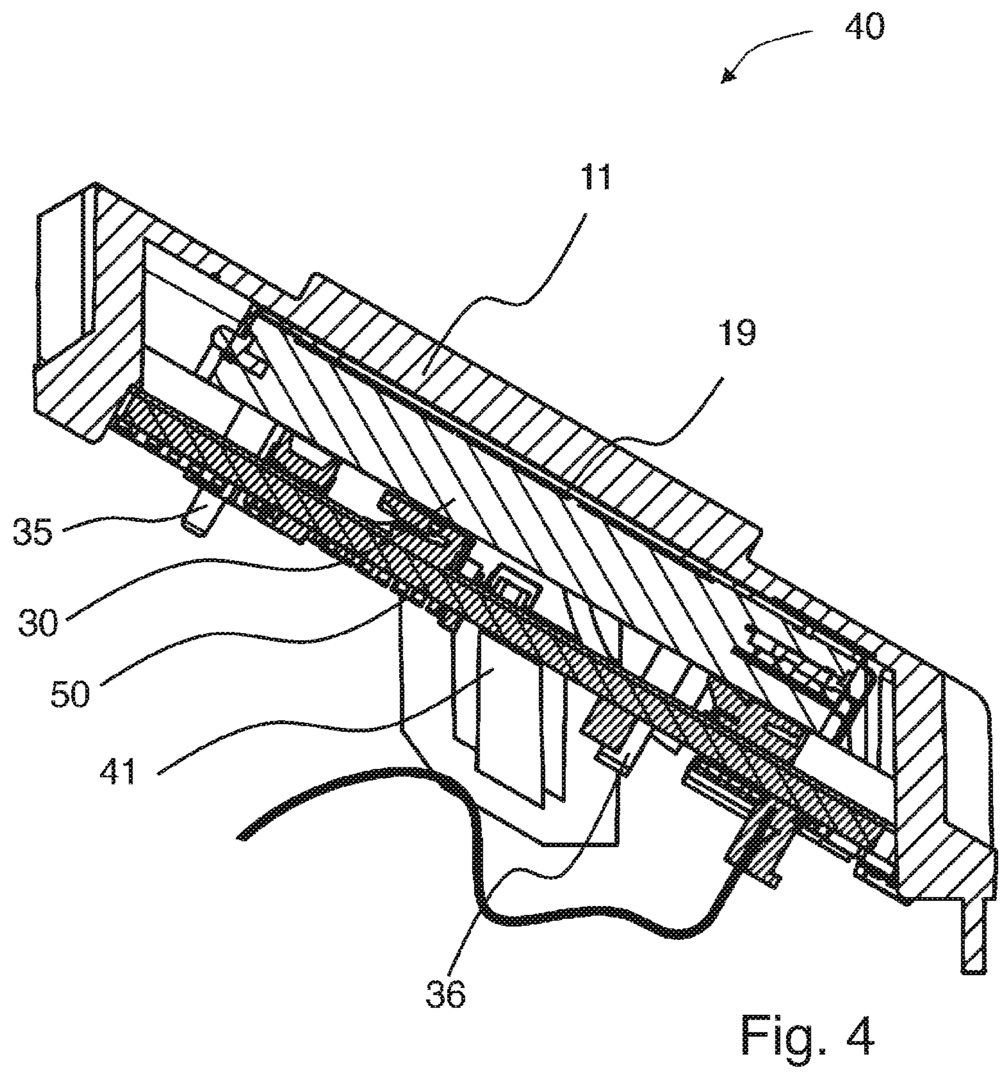
FIG. 4 shows a display holder, in which the display frame is integrated.

FIG. 4 shows an especially advantageous embodiment, in the case of which the above described display frame 30 including support-, or circuit board, is integrated in a display holder 40. Display holder 40 is preferably embodied, in such case, in such a manner that it likewise includes its own retainer elements 41, especially retainer hooks, with which it likewise is secured on the support-, or circuit board, 50. In this way, the display frame 30 with the display 19, the circuit board 50 and the display holder 40 form a unit, or a module. Furthermore, the display holder 30 can also have the interaction-, and viewing, pane 11. This unit, or module, can be integrated in the field device 10 during the manufacturing by a corresponding seating on the field device housing 12, such as shown in FIG. 1.

The invention claimed is:

1. A device for receiving a display, and for introduction into a display holder, for a field device of automation technology, comprising:

an essentially planar, preferably rectangular, device body having a receiving area formed on a first side of the device body for receiving a display;

at least one spring element arranged on a second side of the device body and formed in such a manner that in a restrained state, in which the device is secured on a support plate, the spring element exerts a spring force on the support plate in such a manner that the device presses the display arranged in the receiving area in the direction of a normal vector of the receiving area;

wherein the display frame with the display, the circuit board and the display holder form a unit, or a module;

wherein the unit, or module, can be integrated in a field device during the manufacturing by a corresponding seating on the field device housing.

2. The device as claimed in claim 1, wherein, furthermore, there is arranged on the second side of the device body at least one guide pin, by which the device is positionable on the support plate.

3. The device as claimed in claim 1, wherein on the second side, furthermore, at least one retainer element is formed in the form of a catch or a retainer hook, by which the device is securable on the support plate.

4. The device as claimed in claim 1, wherein a plurality of guide pins and/or a plurality of retainer elements are formed on the second side and, in each case, two guide pins, and, in each case, two retainer elements are arranged diagonally relative to one another on different edges of the basic body.

5. The device as claimed in claim 4, wherein at least one guide pin and at least one retainer element are arranged on each of two opposing edges.

6. The device as claimed in claim 1, further including at least two spring elements, which are arranged in such a manner on the second side that the two spring elements are arranged on opposing edges of the device body.

7. The device as claimed in claim 1, wherein each spring elements is formed in such a manner that it is formed as a resilient quarter circle shaped leg, or bar, which is mounted at one end on the basic body and on the other end in the restrained state presses against the support plate.

8. A field device of automation technology comprising:

a field device housing, which surrounds an inner space;

a viewing pane integrated in or secured on the field device housing for a display;

a display arranged behind the viewing pane in the inner space of the field device housing;

a device as claimed in claim 1 arranged in the inner space of the field device housing, wherein the display is arranged in the receiving area of the device and the device is arranged and restrained in the inner space in such a manner that the at least one spring element presses the display arranged in the receiving area against a rear side of the viewing pane.

9. The field device of automation technology as claimed in 8, further comprising a support plate, preferably a circuit board, correspondingly arranged in the inner space of the field device housing, wherein the device is secured to the support plate and the support plate is arranged in the inner space in such a manner that the device secured thereto because of the at least one spring element presses the display arranged in the receiving area against the rear side of the viewing pane.

10. The field device of automation technology as claimed in claim 9, further comprising a display holder, produced preferably of a plastic, wherein the display holder includes retainer elements, by means of which the display holder is secured to the support plate and wherein the display holder receives the display frame with the display arranged in the receiving area, wherein the display holder preferably includes, furthermore, the viewing pane, such that the display holder, the display frame, the support plate and the viewing pane form a unit, which by a corresponding seating in the field device housing is integrated in the field device, preferably during manufacture of the field device.

* * * * *